US 6,726,488 B2

United States Patent
Shirasaki

(10) Patent No.: US 6,726,488 B2
(45) Date of Patent: Apr. 27, 2004

(54) HIGH-FREQUENCY WIRING BOARD

(75) Inventor: Takayuki Shirasaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/278,579

(22) Filed: Oct. 22, 2002

(65) Prior Publication Data

US 2003/0077924 A1 Apr. 24, 2003

(30) Foreign Application Priority Data

Oct. 24, 2001 (JP) .................................... P2001-325874

(51) Int. Cl.$^7$ ................................................ H01R 9/09
(52) U.S. Cl. ...................... 439/65; 174/266; 333/254; 361/794
(58) Field of Search ................ 174/250, 262, 174/266, 268; 333/34, 35, 254, 255, 256; 361/780, 781, 782, 783, 784, 792, 793, 794, 795; 439/65, 66, 68, 74, 92

(56) References Cited

U.S. PATENT DOCUMENTS 5,819,401 A * 10/1998 Johannes et al. ............. 29/830
6,096,411 A * 8/2000 Nakatani et al. ............ 428/209
6,175,087 B1 * 1/2001 Keesler et al. ............... 174/261
6,388,202 B1 * 5/2002 Swirbel et al. ............... 174/261
6,486,414 B2 * 11/2002 Kobayashi et al. .......... 174/261

FOREIGN PATENT DOCUMENTS

JP    2000-100993    4/2000

* cited by examiner

Primary Examiner—Javaid H. Nasri
Assistant Examiner—Thanh-Tam Le
(74) Attorney, Agent, or Firm—Hogan & Hartson

(57) ABSTRACT

A high-frequency wiring board of the present invention is characterized in that W1>W2 and S1≧S2 are satisfied in which W1 is a line width of a portion having a predetermined characteristic impedance of a line conductor, W2 is a conductor width of the line conductor in proximity to a connection of one end of the line conductor to a through conductor, S1 is an interval between the portion having the line width W1 of the line conductor and a same plane ground conductor, and S2 is an interval between the portion of the one end of the line conductor in proximity to the connection to the through conductor and the same plane ground conductor.

6 Claims, 5 Drawing Sheets

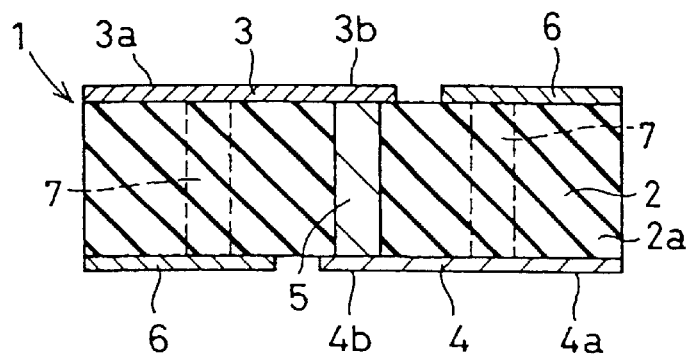
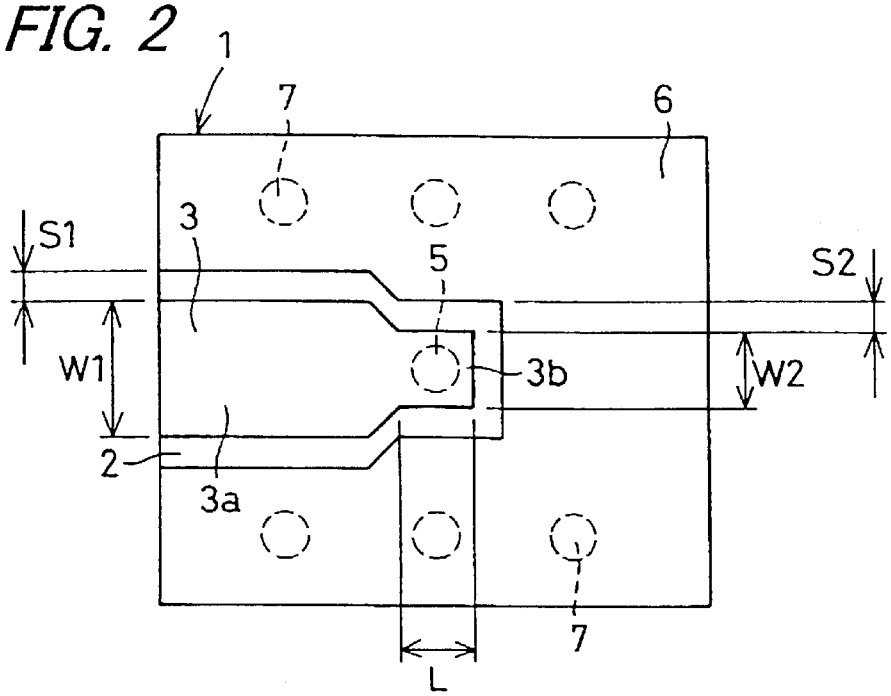

HIGH-FREQUENCY WIRING BOARD

BACKGROUND OF THE INVENTION

1. Field of the Invention

The present invention relates to a high-frequency wiring board for connecting and mounting a high-frequency integrated circuit or a high-frequency circuit device such as an IC and an LSI used in a high-frequency band such as a microwave band and a millimeter waveband, and specifically, relates to a high-frequency wiring board which has a through conductor for signal transmission with an improved high-frequency signal transmission characteristic.

2. Description of the Related Art

As a conventional high-frequency wiring board which transmits a high-frequency signal of a microwave band and a millimeter waveband, there is such a high-frequency wiring board that is shown in a section view of FIG. 8 and a plan view of FIG. 9, for example.

In FIGS. 8, 9, reference numeral 11 denotes a high-frequency wiring board, reference numeral 12 denotes a dielectric layer, a first line conductor 13 and a second line conductor 14 are disposed to upper and lower faces of the dielectric layer 12, and one ends of the first and second line conductors 13, 14 are electrically connected to each other by a through conductor 15. Moreover, same plane ground conductors 16 are disposed to the upper and lower faces of the dielectric layer 12, and the same plane ground conductors 16 are electrically connected to each other by a plurality of ground through conductors 17.

This high-frequency wiring board 11 has such a drawback that because of stray capacities at connections of the first and second line conductors 13, 14 and the through conductor 15, a mismatch of characteristic impedance is caused, with the result that reflection loss of a high-frequency signal increases and a transmission characteristic deteriorates.

Hence, as a technique of matching characteristic impedance of the connections of the line conductors and the through conductor, such a technique that, by widening intervals between the line conductors and the surrounding same plane ground conductors in proximity to the connections to the through conductor, decreases stray capacities to enable matching of characteristic impedance of the connections of the line conductors and the through conductor and enable improvement of a high-frequency signal transmission characteristic is proposed, for example (refer to Japanese Unexamined Patent Publication JP-A 2000-100993 (2000)).

However, the aforementioned conventional high-frequency wiring board has such a problem that in a case where the intervals between the line conductors and the surrounding same plane ground conductors are widened in proximity to the connections to the through conductor, a wavelength of a high-frequency signal is short in a frequency band such as a microwave band and a millimeter waveband, the connections of the line conductors and the through conductor are converting portions of electromagnetic field modes, and thereby unnecessary radiation of electromagnetic waves is caused from between the line conductors and the same plane ground conductors, with the result that a transmission characteristic deteriorates more as a frequency becomes higher.

SUMMARY OF THE INVENTION

The present invention was made in view of the aforementioned problem, and an object thereof is to provide a high-frequency wiring board which enables matching of characteristic impedance at a connection of a line conductor and a through conductor and inhibition of unnecessary radiation of an electromagnetic wave from between the line conductor and a same plane ground conductor and which allows obtaining a good high-frequency signal transmission characteristic even in a high-frequency band such as a microwave band and a millimeter waveband.

The invention provides a high-frequency wiring board comprising:

a first line conductor which is formed on a main face of one dielectric layer of a dielectric board formed of a lamination of a plurality of dielectric layers so that one end thereof exists within the main face of the one dielectric layer;

a second line conductor which is formed on a main face of another dielectric layer in substantially parallel with and in alignment with the first line conductor so that one end thereof opposes to the one end of the first line conductor in a vertical direction;

a through conductor which is formed so as to pierce the dielectric layers and electrically connects the one end of the first line conductor to the one end of the second line conductor; and a same plane ground conductor which is formed at a predetermined interval around the first and/or second line conductor, wherein $W1>W2$ and $S1 \geq S2$ are satisfied in which W1 is a line width of a portion of the first and/or second line conductor surrounded by the same plane ground conductor, W2 is a conductor width of a portion of the first and/or second line conductor in proximity to a connection of the one end of the first and/or second line conductor to the through conductor, S1 is an interval between the portion having the line width W1 of the first and/or second line conductor and the same plane ground conductor, and S2 is an interval between the portion of the first and/or second line conductor in proximity to the connection to the through conductor and the same plane ground conductor.

The invention provides a high-frequency wiring board comprising:

a dielectric board consisting of one dielectric layer;

a first line conductor disposed on one main face of the dielectric board, the first line being formed such that one end of the first line conductor exists in the one main face;

a second line conductor disposed on another main face opposite the one main face of the dielectric board, the second line conductor being formed substantially in a line and substantially in parallel with the first line conductor so that one end of the second line conductor opposes to the one end of the first line conductor at a distance in a thickness direction of the dielectric board;

a through conductor formed so as to pierce the dielectric board, for electrically connecting the one end of the first line conductor to the one end of the second line conductor; and a same plane ground conductor formed at a predetermined interval around the first and/or second line conductor, wherein $W1>W2$ and $S1 \geq S2$ are satisfied in which W1 is a width of a line portion of the first and/or second line conductor having a predetermined characteristic impedance, W2 is a width of a portion of the first and/or second line conductor in proximity to a connection of the one end of the first and/or second line conductor to the through conductor, S1 is an interval between the line portion of the first and/or second line conductor and the same plane ground conductor, and S2 is an interval between the portion of the first and/or second line conductor in proximity to the connection to the through conductor and the same plane ground conductor.

The invention provides a high-frequency wiring board comprising:

a dielectric board formed of a lamination of a plurality of dielectric layers;

a first line conductor disposed on one main face of one of the plurality of dielectric layers, the first line being formed such that one end of the first line conductor exists in the one main face;

a second line conductor disposed on one main face of another one of the plurality of dielectric layers, the second line conductor being formed substantially in a line and substantially in parallel with the first line conductor so that one end of the second line conductor opposes to the one end of the first line conductor at a distance in a lamination direction of the dielectric layers;

a through conductor formed so as to pierce the dielectric board, for electrically connecting the one end of the first line conductor to the one end of the second line conductor; and a same plane ground conductor formed at a predetermined interval around the first and/or second line conductor, wherein W1>W2 and S1≧S2 are satisfied in which W1 is a width of a line portion of the first and/or second line conductor having a predetermined characteristic impedance, W2 is a width of a portion of the first and/or second line conductor in proximity to a connection of the one end of the first and/or second line conductor to the through conductor, S1 is an interval between the line portion of the first and/or second line conductor and the same plane ground conductor, and S2 is an interval between the portion of the first and/or second line conductor in proximity to the connection to the through conductor and the same plane ground conductor.

According to the invention, by the aforementioned construction, regarding the line conductor in proximity to the connection between the line conductor and the through conductor, the conductor width of the one end of the line conductor, that is, the width W2 is made to be narrower than the width W1 of the line portion having a predetermined characteristic impedance, whereby it is possible to decrease a stray capacity at the connection of the one end of the line conductor and the through conductor, and it is possible to match characteristic impedance of the connection of the line conductor and the through conductor. Moreover, the interval S2 between the portion in proximity to the connection of the one end of the line conductor to the through conductor and the same plane ground conductor is made to be narrow to be equal to or less than the space S1 between the portion having a predetermined characteristic impedance and the line width W1 of the line conductor, that is, a line portion, and the same plane ground conductor, whereby it is possible to confine an electromagnetic field at the connection, which is a converting portion of an electromagnetic field mode. Therefore, it is possible to inhibit unnecessary radiation of an electromagnetic wave from between the line conductor of the portion in proximity to the connection of the one end of the line conductor to the through conductor and the same plane ground conductor. As a result, it is possible to realize a good high-frequency signal transmission characteristic in a high-frequency band such as a microwave band and a millimeter waveband.

Further, in the invention it is preferable that a conductor length L of a portion having the conductor width W2 of the portion of the first and/or second line conductor in proximity to the connection of the one end of the first and/or second line conductor to the through conductor is equal to or less than one quarter of a wavelength of a high-frequency signal transmitted through the first and second line conductors and W1≦2×W2 is satisfied.

In the invention it is preferable that a conductor length L of the portion of the first and/or second line conductor in proximity to the connection of the one end of the first and/or second line conductor to the through conductor is equal to or less than one quarter of a wavelength of a high-frequency signal transmitted through the first and second line conductors and W1≦2×W2 is satisfied.

According to the invention, the length of a characteristic impedance matching portion at the connection of the line conductor to the through conductor becomes short enough to a wavelength of a high-frequency signal, and a change of the line width of the line conductor from W1 to W2 is limited within a predetermined range, whereby it is possible to inhibit deterioration of a transmission characteristic due to reflection of a high-frequency signal and so on. As a result, it is possible to realize a good high-frequency signal transmission characteristic even in a high-frequency band such as a microwave band and a millimeter waveband.

According to the invention, in a high-frequency wiring board which has a through conductor for signal transmission, it is possible to match characteristic impedance at a connection of a line conductor and a through conductor and inhibit unnecessary radiation of an electromagnetic wave from between the line conductor and a same plane ground conductor, and it is possible to provide a high-frequency wiring board which can transmit a high-frequency signal with a good transmission characteristic even in a high-frequency band such as a microwave band and a millimeter waveband.

BRIEF DESCRIPTION OF THE DRAWINGS

Other and further objects, features, and advantages of the invention will be more explicit from the following detailed description taken with reference to the drawings wherein:

FIG. 1 is a section view showing one embodiment of a high-frequency wiring board of the present invention;

FIG. 2 is a plan view showing the one embodiment of the high-frequency wiring board of the invention;

DETAILED DESCRIPTION OF THE PREFERRED EMBODIMENTS

Figure 3:
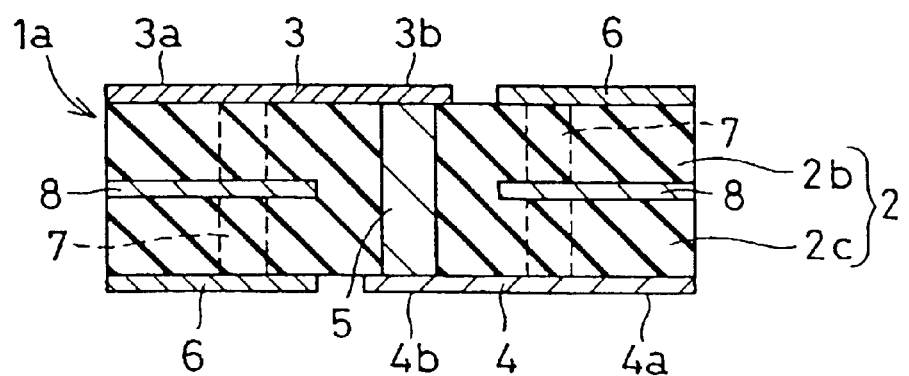
FIG. 3 is a section view showing another embodiment of the high-frequency wiring board of the invention.

Now referring to the drawings, preferred embodiments of the invention are described below.

FIGS. 1 and 2 are a section view and a plan view showing one embodiment of a high-frequency wiring board of the present invention. In these drawings, reference numeral 1 denotes a high-frequency wiring board. Reference numeral 2a denotes a dielectric layer which forms a dielectric board 2, and in this embodiment, a first line conductor 3 and a second line conductor 4 are disposed to an upper face, which is one main face of the dielectric board 2 formed by the one layer of dielectric layer 2a, and to a lower face, which is the other main face opposed to the one main face. These first line conductor 3 and second line conductor 4 are formed in substantially parallel and in alignment so that one ends thereof oppose to each other at a distance in a vertical direction, which is a thickness direction of the dielectric board 2. The one end of the first line conductor 3 and the one end of the second line conductor 4 are electrically connected to each other by a through conductor 5. Moreover, same plane ground conductors 6 formed at predetermined intervals around the first and second line conductors 3, 4 are disposed to the upper and lower faces of the dielectric layer 2a. The same plane ground conductors 6 on the upper and lower faces are electrically connected to each other by a plurality of ground through conductors 7. Here, FIG. 2 is a plan view showing the side of the first line conductor 3.

The high-frequency wiring board 1 of the invention is characterized in that, as shown in FIG. 2, W1>W2 and S1≧S2 are satisfied in which W1 is a width of a line portion 3a having a predetermined characteristic impedance of the first line conductor 3, W2 is a conductor width of a portion 3b of the first line conductor 3 in proximity to a connection of the one end of the first line conductor 3 to the through conductor 5, S1 is an interval between the line portion 3a having the line width W1 of the first line conductor 3 and the same plane ground conductor 6, and S2 is an interval between the portion 3b having the conductor width W2 in proximity to the connection of the one end of the first line conductor 3 to the through conductor 5 and the same plane ground conductor 6.

In other words, the high-frequency wiring board 1 of the invention is characterized in that W1>W2 and S1≧S2 are satisfied in which W1 is a width of a line portion 3a of the first line conductor 3 having a predetermined characteristic impedance, W2 is a width of a portion 3b of the first line conductor 3 in proximity to a connection of the one end of the first line conductor 3 to the through conductor 5, S1 is an interval between the line portion 3a of the first line conductor 3 and the same plane ground conductor 5, and S2 is an interval between the portion 3b of the first line conductor 3 in proximity to the connection to the through conductor 5 and the same plane ground conductor 6.

In this embodiment, the second line conductor 4 formed on the other main face of the dielectric layer 2a and the through conductor 5, and the surrounding same plane ground conductor 6 are constructed in the same manner. In other words, the second line conductor 4 has a line portion 4a having a predetermined characteristic impedance and a portion 4b in proximity to the connection of the one end thereof to the through conductor 5.

By such a construction, regarding stray capacities at the connections of the first and second line conductors 3, 4 and the through conductor 5 connecting the one ends thereof, which is a problem in a high-frequency band such as a microwave band and a millimeter waveband, the conductor widths of the portions 3b, 4b in proximity to the connections of the one ends of the first and second line conductors 3, 4 to the through conductor 5, that is, the widths W2 of the line conductors, are made to be narrower than the line widths W1 of the line portions 3a, 4a of line conductors having a predetermined characteristic impedance, whereby it is possible to decrease stray capacities at the connections. Moreover, regarding unnecessary radiation of electromagnetic waves from between the first and second line conductors 3, 4 and the same plane ground conductors 6, the intervals S2 between the portions 3b, 4b in proximity to the connections of the one ends of the first and second line conductors 3, 4 to the through conductor 5 and the same plane ground conductors 6 are made to be narrow to be equal to or less than the intervals S1 between the portions having the line widths W1, that is, the line portions 3a, 4a of the first and second line conductors 3, 4, and the same plane ground conductors 6, whereby it is possible to confine electromagnetic fields at the connections, which are converting portions of electromagnetic field modes. Therefore, it is possible to inhibit unnecessary radiation of electromagnetic waves from between the portions 3b, 4b in proximity to the connections of the one ends of the first and second line conductors 3, 4 to the through conductor 5 and the same plane ground conductors 6. As a result, it is possible to realize a good high-frequency signal transmission characteristic even in a high-frequency band such as a microwave band and a millimeter waveband.

Furthermore, it is preferable that conductor lengths L of the portions 3b, 4b having the conductor widths W2 in proximity to the connections of the one ends of the first and second line conductors 3, 4 to the through conductor 5 are equal to or less than one quarter of a wavelength of a high-frequency signal transmitted through the first and second line conductors 3, 4 and W1≦2×W2 is satisfied. In other words, it is preferable that conductor lengths L of the portions 3b, 4b in proximity to the connections of the one ends of the first and second line conductors 3, 4 to the through conductor 5 are equal to or less than one quarter of a wavelength of a high-frequency signal transmitted by the first and second line conductors 3, 4 and W1≦2×W2 is satisfied. By such a construction, the lengths of characteristic impedance matching portions at the connections of the one ends of the first and second line conductors 3, 4 and the through conductor 5 become short enough to a wavelength of a high-frequency signal, and changes of the line widths of the first and second line conductors 3, 4 from W1 to W2 are limited within a predetermined range, whereby it is possible to inhibit deterioration of a transmission characteristic due to reflection of a high-frequency signal and so on.

Figure 4:
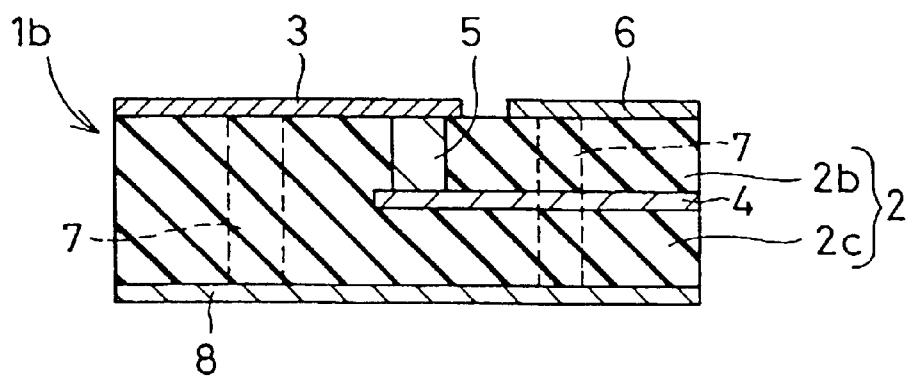
FIG. 4 is a section view showing still another embodiment of the high-frequency wiring board of the invention.
Figure 5:
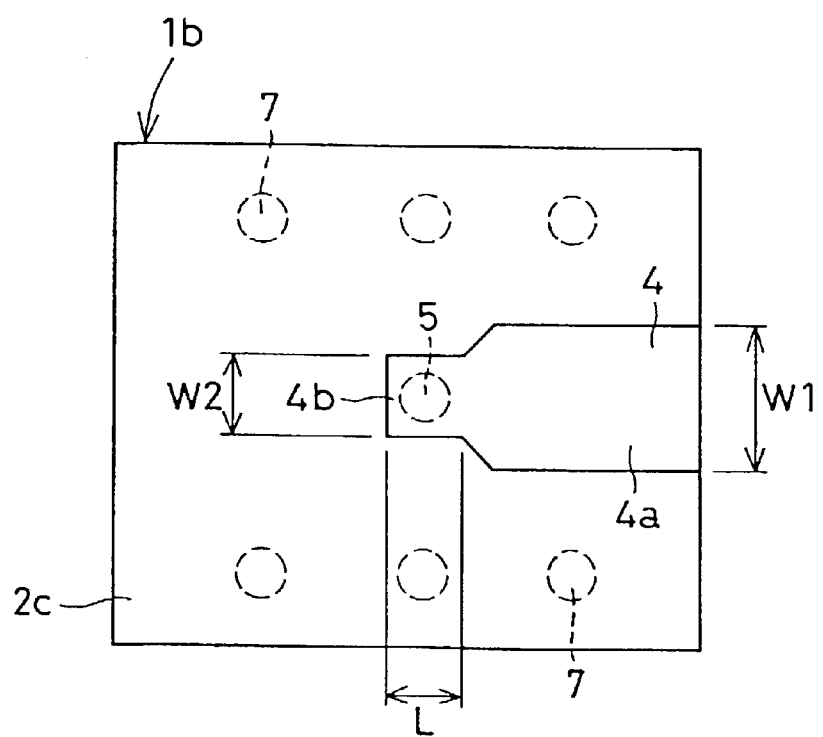
FIG. 5 is a plan view showing still another embodiment of the high-frequency wiring board of the invention.

Next, in FIGS. 3 to 5, other embodiments of the high-frequency wiring board of the invention will be shown in section views and a plan view.

In FIGS. 3 to 5, the same components as in FIGS. 1 and 2 are denoted by the same reference numerals. In these drawings, reference numerals 1a, 1b denote a high-frequency wiring board, reference numeral 2 denotes a dielectric board, reference numerals 2b, 2c denote a dielectric layer, reference numerals 3, 4 denote first and second line conductors, reference numeral 5 denotes a through conductor which electrically connects one end of the first line conductor 3 to one end of the second line conductor 4, and reference numeral 6 denotes a same plane ground conductor which is formed on the same plane as the first and/or second line conductor 3, 4. Moreover, reference numeral 8 denotes a ground conductor, and reference numeral 7 denotes a ground through conductor which electrically connects the same plane ground conductors 6 and/or connects the same plane ground conductor 6 to the ground conductor 8.

FIG. 3 is a section view showing another embodiment of the high-frequency wiring board of the invention. Reference numeral 1a denotes a high-frequency wiring board. Reference numerals 2b, 2c denote a plurality of dielectric layers which form a dielectric board 2, and in this embodiment, a first line conductor 3 and a second line conductor 4 are disposed to an upper face, which is one main face of the one dielectric layer 2b, and to a lower face, which is one main face of the other dielectric layer 2c, of the dielectric board 2 formed by the two layers of dielectric layers 2b, 2c. These first line conductor 3 and second line conductor 4 are formed in substantially parallel and in alignment so that one ends thereof opposes to each other in a vertical direction, which is a lamination direction of the dielectric layers 2b, 2c. The one end of the first line conductor 3 and the one end of the second line conductor 4 are electrically connected to each other by a through conductor 5. Moreover, same plane ground conductors 6 formed at predetermined intervals around the first and second line conductors 3, 4 are disposed to the upper and lower faces of the dielectric board, and ground conductors 8 are disposed between the two layers of dielectric layers 2b, 2c. The same plane ground conductors 6 on the upper and lower faces and the ground conductors 8 in an internal layer are electrically connected by a plurality of ground through conductors 7.

By such a construction, regarding stray capacities at the connections of the first and second line conductors 3, 4 and the through conductor 5 connecting the one ends thereof, which is a problem in a high-frequency band such as a microwave band and a millimeter waveband, the conductor widths of the portions 3b, 4b in proximity to the connections of the one ends of the first and second line conductors 3, 4 to the through conductor 5, that is, the line widths W2 of the line conductors are made to be narrower than the line widths W1 of the line portions 3a, 4a of the line conductors having a predetermined characteristic impedance, whereby it is possible to decrease stray capacities at the connections. Moreover, regarding unnecessary radiation of electromagnetic waves from between the first and second line conductors 3, 4 and the same plane ground conductors 6, the intervals S2 between the portions 3b, 4b in proximity to the connections of the one ends of the first and second line conductors 3, 4 to the through conductor 5 and the same plane ground conductors 6 are made to be narrow to be equal to or less than the intervals S1 between the portions having the line widths W1 and the same plane ground conductors 6, whereby it is possible to confine electromagnetic fields at the connections, which are converting portions of electromagnetic field modes, and therefore it is possible to inhibit unnecessary radiation of electromagnetic waves from between the portions 3b, 4b in proximity to the connections of the one ends of the first and second line conductors 3, 4 to the through conductor 5 and the same plane ground conductors 6. As a result, it is possible to realize a good high-frequency signal transmission characteristic even in a high-frequency band such as a microwave band and a millimeter waveband.

Next, FIGS. 4 and 5 are a section view and a plan view showing still another embodiment of the high-frequency wiring board of the invention. In these drawings, reference numeral 1b denotes a high-frequency wiring board. Reference numeral 2 denotes a dielectric board and reference numerals 2b, 2c denote a plurality of dielectric layers which form the dielectric board 2, and in this embodiment, a first line conductor 3 is disposed to an upper face of the dielectric board 2 formed by the two layers of dielectric layers 2b, 2c, that is, one main face of the one dielectric layer 2b, and a second line conductor 4 is disposed between layers of the two layers of dielectric layers 2b, 2c. These first line conductor 3 and second line conductor 4 are formed in substantially parallel and in alignment so that one ends thereof opposes to each other in a vertical direction, which is a lamination direction of the dielectric layers 2b, 2c. The one end of the first line conductor 3 and the one end of the second line conductor 4 are electrically connected to each other by a through conductor 5. Moreover, a same plane ground conductor 6 formed at a predetermined interval around the first line conductor 3 is disposed to the upper face of the dielectric board, and a ground conductor 8 is disposed to the lower face of the dielectric board 2, that is, the other main face of the other dielectric layer 2b. The same plane ground conductor 6 and the ground conductor 8 are electrically connected to each other by a plurality of ground through conductors 7. Here, FIG. 5 is a plan view showing the upper face, which is the one main face, of the dielectric layer 2b where the second line conductor 4 is formed, and the first line conductor 3 and the surrounding same plane ground conductor 6 are constructed in the same manner as in the embodiment shown in FIG. 2.

By such a construction, regarding a stray capacity at the connection of the first line conductor 3 and the through conductor 5 connecting the one end thereof and the one end of the second line conductor 4, which is a problem in a high-frequency band such as a microwave band and a millimeter waveband, the conductor width of the portion 3b in proximity to the connection of the one end of the first line conductor 3 to the through conductor 5, that is, the width W2 of the line conductor, is made to be narrower than the line width W1 of the line portion 3a of the line conductor having a predetermined characteristic impedance, whereby it is possible to decrease a stray capacity at the connection. Moreover, regarding unnecessary radiation of an electromagnetic wave from between the first line conductor 3 and the same plane ground conductor 6, the interval S2 between the portion 3b in proximity to the connection of the one end of the first line conductor 3 to the through conductor 5 and the same plane ground conductor 6 is made to be narrow to be equal to or less than the interval S1 between a portion having the line width W1, that is, the line portion 3a of the first line conductor 3, and the same plane ground conductor 6, whereby it is possible to confine an electromagnetic field at the connection, which is a converting portion of an electromagnetic field mode, and therefore it is possible to inhibit unnecessary radiation of an electromagnetic wave from between the first line conductor 3 and the same plane ground conductor 6. As a result, it is possible to realize a good high-frequency signal transmission characteristic even in a high-frequency band such as a microwave band and a millimeter waveband.

As described above, in the high-frequency wiring board 1 of the invention, the first line conductor 3, the second line conductor 4, the through conductor 5, the dielectric layers 2b, 2c, the same plane ground conductor 6, the ground through conductor 7 and the ground conductor 8 can be placed and shaped in a variety of manners.

As a material of the dielectric layers 2a, 2b, 2c forming the dielectric board 2 in the high-frequency wiring board 1, 1a, 1b of the invention, a ceramics material such as alumina ($Al_2O_3$) ceramics and mullite ($3Al_2O_3 \cdot 2SiO_2$) ceramics, an inorganic material such as glass ceramics, or a resin material such as a fluorocarbon resin like a tetrafluoroethylene resin (polytetrafluoroethylene; PTFE), a tetrafluoroethylene-ethylene copolymer resin (ETFE) and a tetrafluoroethylene-perfluoroalkoxyethylene copolymer resin (a tetrafluoroethylene-perfluoroalkylvinylether copolymer resin; PFA), a glass epoxy resin, a polyphenylene ether resin, liquid crystal polyester and polyimide is used. Moreover, the shapes and the dimensions (thickness, width and length) of the high-frequency wiring boards 1, 1a, 1b are set with reference to a frequency of a high-frequency signal to be used, characteristic impedance and so on.

The first line conductor 3 and the second line conductor 4 in the high-frequency wiring boards 1, 1a, 1b of the invention are made by a conductor layer of a metal material suitable for transmission of a high-frequency signal, for example, made by a Cu layer, an Mo—Mn layer, a W layer, an Mo—Mn metalized layer coated with an Ni plating layer and an Au plating layer, a W metalized layer coated with an Ni plating layer and an Au plating layer, a Cr—Cu alloy layer, a Cr—Cu alloy layer coated with an Ni plating layer and an Au plating layer, a $Ta_2N$ layer coated with an Ni—Cr alloy layer and an Au plating layer, a Ti layer coated with a Pt layer and an Au plating layer, or an Ni—Cr alloy layer coated with a Pt layer and an Au plating layer, and formed by a thick film printing method, a variety of thin film forming methods, a plating method or the like. The thickness and width thereof are also set with reference to a frequency of a high-frequency signal to be transmitted, characteristic impedance and so on.

Furthermore, the same plane ground conductor 6 and the ground conductor 8 can be formed of the same material and by the same method as the first line conductor 3 and the second line conductor 4, and intervals between the first and second line conductors 3, 4 and the same plane ground conductors 6 are set in accordance with a frequency of a high-frequency signal to be transmitted, characteristic impedance and so on. Moreover, the through conductor 5 is formed so as to electrically connect the first line conductor 3 and the second line conductor 4, and can be disposed by, for example, forming a through hole conductor or a via hole conductor or burying a metal plate, a metal bar, a metal pipe or the like. Besides, the ground through conductor 7 is formed so as to connect the same plane ground conductors 6 to each other and connect the same plane ground conductor 6 to the ground conductor 8, and can be disposed by, for example, forming a through hole conductor or a via hole conductor or burying a metal plate, a metal bar, a metal pipe or the like.

In production of the high-frequency wiring boards 1, 1a, 1b, for example, in a case where the dielectric layers 2a, 2b, 2c are made of glass ceramics, green sheets of glass ceramics which become the dielectric layers 2a, 2b, 2c are prepared firstly. The sheets are subjected to predetermined punching, and coated with conductor paste of Cu, Ag or the like by a screen printing method or the like in accordance with conductor patterns of the first and second line conductors 3, 4, the through conductor 5, the same plane ground conductor 6, the ground through conductor 7 and the ground conductor 8, respectively. Secondly, the sheets are fired at approximately 1000° C., and lastly, Ni plating and Au plating are applied on the respective conductor layers.

(Working Example)

Next, a working example of the high-frequency wiring board of the invention will be explained below.

In the high-frequency wiring board 1, on the upper and lower faces of the dielectric layer 2a made of glass ceramics with a dielectric constant of 6 and having a thickness of 0.2 mm, as the first line conductor 3 and the second line conductor 4, line conductors made by adhering an Ni plating layer and an Au plating layer on a Cu metalized layer having the line width W1 of 0.28 mm and the conductor width W2 of 0.12 mm were formed, respectively. Moreover, conductors made of Cu metalized layers were formed as the same plane ground conductors 6 on the almost entire upper and lower faces of the dielectric layer 2. As to the intervals between the first and second line conductors 3, 4 and the same plane ground conductors 6, S1 was set to 0.11 mm, and S2 was set to 0.1 mm. The through conductor 5 connecting the one end of the first line conductor 3 and the one end of the second line conductor 4 was made of Cu metalized and substantially circular in cross sectional shape with a diameter of 0.075 mm. Thus, a sample A of the high-frequency wiring board 1 of the invention was obtained.

Figure 8:
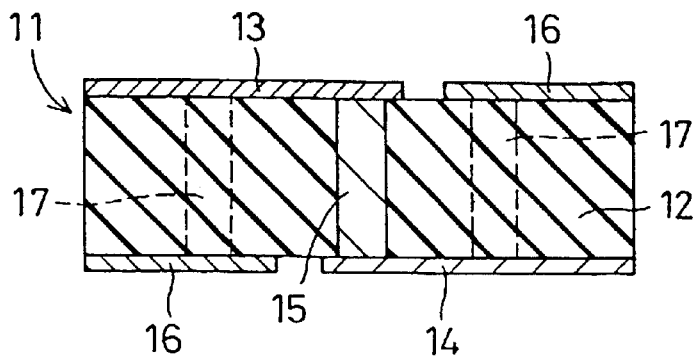
FIG. 8 is a section view showing an example of a conventional high-frequency wiring board.
Figure 9:
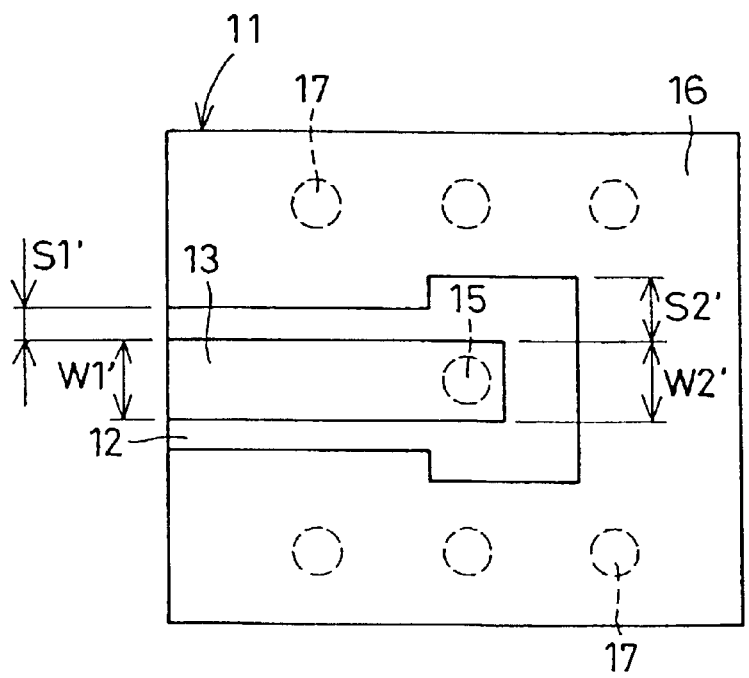
FIG. 9 is a plan view showing the example of the conventional high-frequency wiring board.

On the other hand, as a comparison example, in the construction shown in FIGS. 8 and 9, a dielectric layer 12, a first line conductor 13, a second line conductor 14, a through conductor 15, same plane ground conductors 16 and ground through conductors 17 were formed in the same manner as in the sample A. Both line widths W1' and conductor widths W2' of the first and second line conductors 13, 14 were set to 0.28 mm, as to intervals between the first and second line conductors 13, 14 and the same plane ground conductors 16, S1' was set to 0.11 mm, and S2' was set to 0.2 mm. Thus, a sample B of a high-frequency wiring board 11 of the comparison example was obtained.

These samples A, B of the high-frequency wiring boards of a working example of the invention and a comparison example were connected to a network analyzer by means of a wafer probe, and reflection loss and transmission loss to a high-frequency signal were measured. The result of a reflection characteristic is shown in FIG. 6, and the result of a transmission characteristic is shown in FIG. 7.

Figure 6:
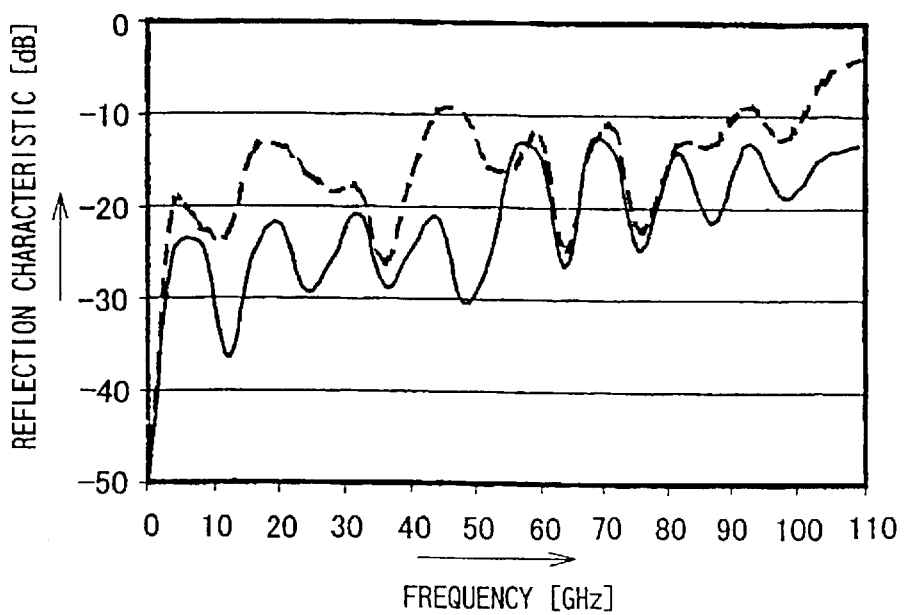
FIG. 6 is a graph showing frequency characteristics of reflection loss of a high-frequency signal regarding high-frequency wiring boards of a working example of the invention and a comparison example.

FIG. 6 is a graph showing frequency characteristics of reflection loss of a high-frequency signal in the samples A, B, where a frequency (unit: GHz) is shown on the lateral axis and reflection loss (unit: dB) is shown on the longitudinal axis. Moreover, of characteristic curves, a solid line shows a frequency characteristic of reflection loss of the sample A and a dashed line shows that of the sample B.

It is apparent from the result shown in FIG. 6 that the sample A of the working example of the invention realizes, up to a frequency of 110 GHz, a good frequency characteristic of reflection loss of −13 dB or less. By contrast, in the sample B of the comparison example, reflection loss increases at frequencies around 40 GHz and around 100 GHz, and the value thereof is over −10 dB. In the sample A of the working example of the invention, such characteristic deterioration is not recognized in a frequency range shown in the drawing, and a good characteristic is obtained.

Figure 7:
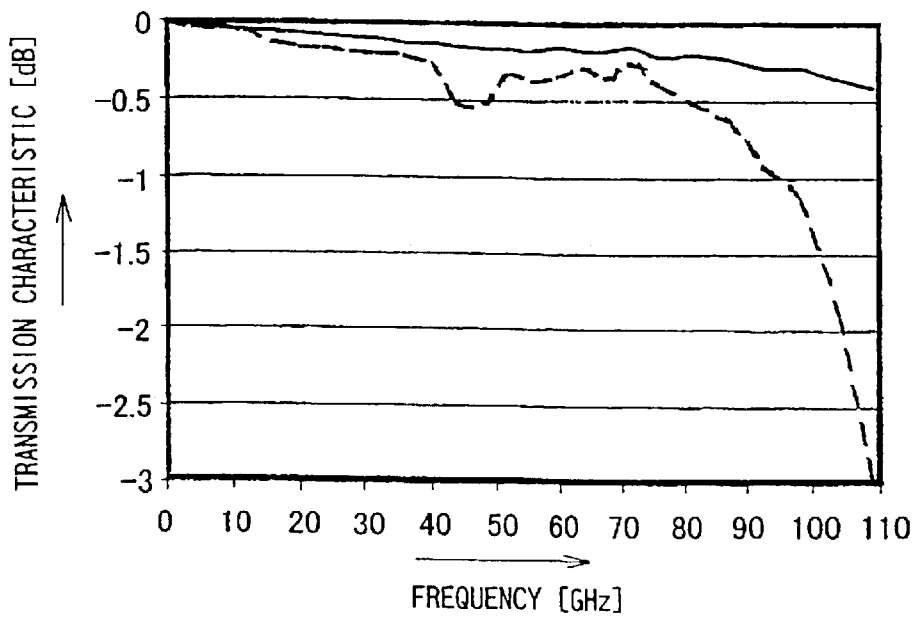
FIG. 7 is a graph showing frequency characteristics of transmission loss of a high-frequency signal regarding the high-frequency wiring boards of the working example of the invention and the comparison example.

FIG. 7 is a graph showing frequency characteristics of transmission loss of a high-frequency signal in the samples A, B, where a frequency (unit: GHz) is shown on the lateral axis and a transmission loss (unit: dB) is shown on the longitudinal axis. Moreover, of characteristic curves, a solid line shows a frequency characteristic of transmission loss of the sample A and a dashed line shows that of the sample B.

It is apparent from the result shown in FIG. 7 that in the sample B of the comparison example, transmission loss drastically increases around 40 GHz and around 80 GHz or more, whereas in the sample A of the working example of the invention, a good and flat characteristic is obtained over a wide band.

Therefore, according to the high-frequency wiring board of the invention, W1>W2 and S1≧S2 are satisfied, in which W1 is the line width of the line portion having a predetermined characteristic impedance of the line conductor, W2 is the conductor width of a portion of the line conductor in proximity to the connection of the one end of the line conductor to the through conductor, S1 is the interval between the line portion having a predetermined characteristic impedance of the line conductor and the same plane ground conductor, and S2 is the interval between the portion of the one end of the line conductor in proximity to the connection to the through conductor and the same plane ground conductor, with the result that a change of characteristic impedance and unnecessary radiation are small even in a high-frequency signal of a microwave band and a millimeter waveband, and it can be confirmed that a good transmission characteristic can be realized over a wide band.

Furthermore, regarding the sample A, when the conductor length L of the portion having the conductor width W2 in proximity to the connection of the one end of the line conductor to the through conductor is equal to or less than one quarter of a wavelength of a high-frequency signal transmitted through the line conductor and $W1 \leq 2 \times W2$ is satisfied, a good frequency characteristic of reflection loss of −15 dB or less is obtained.

The invention is not limited to the above embodiments, and various changes may be made without departing from the scope of the invention. For example, although the first line conductor 3 is formed on the upper face of the dielectric layer 2a, 2b in all of the above embodiments, the first line conductor 3 may be formed between the plurality of dielectric layers 2b, 2c.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency wiring board comprising:
    a first line conductor which is formed on a main face of one dielectric layer of a dielectric board formed of a lamination of a plurality of dielectric layers so that one end thereof exists within the main face of the one dielectric layer;
    a second line conductor which is formed on a main face of another dielectric layer in substantially parallel with and in alignment with the first line conductor so that one end thereof opposes to the one end of the first line conductor in a vertical direction;
    a through conductor which is formed so as to pierce the dielectric layers and electrically connects the one end of the first line conductor to the one end of the second line conductor; and
    a same plane ground conductor which is formed at a predetermined interval around the first and/or second line conductor,
    wherein $W1 > W2$ and $S1 \geq S2$ are satisfied in which W1 is a line width of a portion of the first and/or second line conductor surrounded by the same plane ground conductor, W2 is a conductor width of a portion of the first and/or second line conductor in proximity to a connection of the one end of the first and/or second line conductor to the through conductor, S1 is an interval between the portion having the line width W1 of the first and/or second line conductor and the same plane ground conductor, and S2 is an interval between the portion of the first and/or second line conductor in proximity to the connection to the through conductor and the same plane ground conductor.

2. The high-frequency wiring board of claim 1, wherein a conductor length L of a portion having the conductor width W2 of the portion of the first and/or second line conductor in proximity to the connection of the one end of the first and/or second line conductor to the through conductor is equal to or less than one quarter of a wavelength of a high-frequency signal transmitted through the first and second line conductors and $W1 \leq 2 \times W2$ is satisfied.

3. A high-frequency wiring board comprising:
    a dielectric board consisting of one dielectric layer;
    a first line conductor disposed on one main face of the dielectric board, the first line being formed such that one end of the first line conductor exists in the one main face;
    a second line conductor disposed on another main face opposite the one main face of the dielectric board, the second line conductor being formed substantially in a line and substantially in parallel with the first line conductor so that one end of the second line conductor opposes to the one end of the first line conductor at a distance in a thickness direction of the dielectric board;
    a through conductor formed so as to pierce the dielectric board, for electrically connecting the one end of the first line conductor to the one end of the second line conductor; and
    a same plane ground conductor formed at a predetermined interval around the first and/or second line conductor,
    wherein $W1 > W2$ and $S1 \geq S2$ are satisfied in which W1 is a width of a line portion of the first and/or second line conductor having a predetermined characteristic impedance, W2 is a width of a portion of the first and/or second line conductor in proximity to a connection of the one end of the first and/or second line conductor to the through conductor, S1 is an interval between the line portion of the first and/or second line conductor and the same plane ground conductor, and S2 is an interval between the portion of the first and/or second line conductor in proximity to the connection to the through conductor and the same plane ground conductor.

4. The high-frequency wiring board of claim 3, wherein a conductor length L of the portion of the first and/or second line conductor in proximity to the connection of the one end of the first and/or second line conductor to the through conductor is equal to or less than one quarter of a wavelength of a high-frequency signal transmitted through the first and second line conductors and $W1 \leq 2 \times W2$ is satisfied.

5. A high-frequency wiring board comprising:
    a dielectric board formed of a lamination of a plurality of dielectric layers;
    a first line conductor disposed on one main face of one of the plurality of dielectric layers, the first line being formed such that one end of the first line conductor exists in the one main face;
    a second line conductor disposed on one main face of another one of the plurality of dielectric layers, the second line conductor being formed substantially in a line and substantially in parallel with the first line conductor so that one end of the second line conductor opposes to the one end of the first line conductor at a distance in a lamination direction of the dielectric layers;

a through conductor formed so as to pierce the dielectric board, for electrically connecting the one end of the first line conductor to the one end of the second line conductor; and a same plane ground conductor formed at a predetermined interval around the first and/or second line conductor, wherein W1>W2 and S1≧S2 are satisfied in which W1 is a width of a line portion of the first and/or second line conductor having a predetermined characteristic impedance, W2 is a width of a portion of the first and/or second line conductor in proximity to a connection of the one end of the first and/or second line conductor to the through conductor, S1 is an interval between the line portion of the first and/or second line conductor and the same plane ground conductor, and S2 is an interval between the portion of the first and/or second line conductor in proximity to the connection to the through conductor and the same plane ground conductor.

6. The high-frequency wiring board of claim 5, wherein a conductor length L of the portion of the first and/or second line conductor in proximity to the connection of the one end of the first and/or second line conductor to the through conductor is equal to or less than one quarter of a wavelength of a high-frequency signal transmitted through the first and second line conductors and W1≦2×W2 is satisfied.

* * * * *